(12) United States Patent
Lee

(10) Patent No.: US 7,561,479 B2
(45) Date of Patent: Jul. 14, 2009

(54) SEMICONDUCTOR MEMORY DEVICE HAVING A DEVELOP REFERENCE VOLTAGE GENERATOR FOR SENSE AMPLIFIERS

(75) Inventor: Dong-Su Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 5 days.

(21) Appl. No.: 11/465,314

(22) Filed: Aug. 17, 2006

(65) Prior Publication Data

US 2007/0047331 A1 Mar. 1, 2007

(30) Foreign Application Priority Data

Aug. 29, 2005 (KR) ............... 10-2005-0079273

(51) Int. Cl.
*G11C 5/14* (2006.01)
(52) U.S. Cl. ................... 365/189.09; 365/207
(58) Field of Classification Search ............ 365/189.09, 365/207
See application file for complete search history.

(56) References Cited

U.S. PATENT DOCUMENTS

| 6,087,891 | A | 7/2000 | Yoon et al. | |
|---|---|---|---|---|
| 6,999,338 | B1 * | 2/2006 | Hirabayashi | 365/154 |
| 7,038,963 | B2 * | 5/2006 | Lee | 365/207 |
| 2004/0001385 | A1 * | 1/2004 | Kang | 365/226 |
| 2004/0022115 | A1 * | 2/2004 | Park et al. | 365/226 |
| 2005/0128844 | A1 * | 6/2005 | Yamagami | 365/207 |

FOREIGN PATENT DOCUMENTS

| JP | 2001-216779 | 8/2001 |
|---|---|---|
| KR | 97-51230 | 7/1997 |
| KR | 1999-0038108 | 6/1999 |
| KR | 10-2004-0087495 | 10/2004 |

OTHER PUBLICATIONS

English language abstract of Korean Publication No. 97-51230.
English language abstract of Korean Publication No. 1999-0038108.
English language abstract of Japanese Publication No. 2001-216779.
English language abstract of Korean Publication No. 10-2004-0087495.

* cited by examiner

*Primary Examiner*—Huan Hoang
*Assistant Examiner*—Kretelia Graham
(74) *Attorney, Agent, or Firm*—Marger Johnson & McCollom, P.C.

(57) ABSTRACT

I describe and claim a device and method for generating develop voltage signals. The device includes a sense amplifier to sense a voltage difference between a plurality of bit lines responsive to a develop voltage signal, and a voltage generator to generate the develop voltage signal responsive to a reference voltage signal and according to an electrical characteristic of at least one transistor associated with the sense amplifier.

24 Claims, 6 Drawing Sheets

SEMICONDUCTOR MEMORY DEVICE HAVING A DEVELOP REFERENCE VOLTAGE GENERATOR FOR SENSE AMPLIFIERS

CROSS-REFERENCE TO RELATED PATENT APPLICATION

This application claims priority from Korean Patent Application No. 10-2005-0079273, filed on Aug. 29, 2005, which we incorporate by reference.

BACKGROUND OF THE INVENTION

1. Field of the Invention

The present invention relates to memory devices, and more particularly, to the stabilization of the sensing speed of sense amplifiers included in memory devices.

2. Description of the Related Art

Generally, semiconductor memory devices include an internal power supply voltage circuit to supply an internal power supply voltage to other circuits associated with the memory devices. An example of a circuit for generating the internal power supply voltage is disclosed in U.S. Pat. No. 6,087,891. The internal power supply voltage is usually generated by reducing the voltage level of the external power supply voltage.

For instance, sense amplifiers included in memory devices use an internally generated develop voltage to develop a voltage between a pair of bit lines. The develop voltage is generated by a develop voltage generator in response to a develop reference voltage from a develop reference voltage generator. The develop voltage generator generates a develop voltage that has a high current level and has the same voltage level as the develop reference voltage.

FIG. 1 is a circuit diagram illustrating a develop reference voltage generator included in a conventional semiconductor memory device. Referring to FIG. 1, the develop reference voltage generator includes a differential amplifier and a voltage divider. The differential amplifier includes two PMOS transistors P1 and P2 connected to a first power supply voltage VDD, and two NMOS transistors N1 and N2 connected to the PMOS transistors P1 and P2, respectively. A reference voltage Vref is applied to a gate of NMOS transistor N1, and an input voltage Vin is applied to a gate of the NMOS transistor N2.

The differential amplifier includes an NMOS transistor N3 coupled between the NMOS transistors N1 and N2 and a second power supply voltage Vss. A predetermined bias voltage is applied to a gate of the NMOS transistor N3 to perform differential amplifying operations. The differential amplifying operations are performed until the first reference voltage Vref and the input voltage Vin become equal to each other. In other words, the input voltage Vin is set to the reference voltage Vref by the differential amplifying operations.

The voltage divider includes a plurality of resistors R1, R2, and R3. The differential amplifier applies the input voltage Vin to the voltage divider between the resistors R1 and R2. A voltage proportional to the input voltage Vin output by the voltage divider as a develop reference voltage Vrefa. For example, when the reference voltage Vref is 1.0 V, the develop reference voltage Vrefa may become 1.2 V by changing the value of the resistors R1, R2, and R3.

A develop voltage generator (not shown) receives the develop reference voltage Vrefa from the develop reference voltage generator and generates a develop voltage that has a high current level and has the same voltage as the develop reference voltage Vrefa. The develop voltage generator provides the develop voltage to a sense amplifier (not shown) for use in sensing operations.

Since the manufacture or processing of sense amplifiers is inconsistent, many sense amplifiers require different levels of develop voltages to operate optimally or with a stable sensing speed. Particularly, sense amplifiers include one or more transistors having threshold voltages that vary depending on their manufacturing process. The develop reference voltage generator shown in FIG. 1, however, provides a uniform develop reference voltage regardless of manufacturing variations. Accordingly, the sensing speeds of the sense amplifiers are unstable in each die of a semiconductor memory device. This problem becomes magnified when attempting to manufacture circuits with low power consumption, thus reducing the allowable voltage difference between the develop voltage and the threshold voltage of the sense amplifier transistors.

SUMMARY OF THE INVENTION

Embodiments of the present invention provide a device to stabilize sensing speeds of sense amplifiers by varying a develop reference voltage according to variations of a threshold voltage of transistors included in the sense amplifiers. The device includes a sense amplifier to sense a voltage difference between a plurality of bit lines responsive to a develop voltage signal, and a voltage generator to generate the develop voltage signal responsive to a reference voltage signal and according to an electrical characteristic of at least one transistor associated with the sense amplifier.

DESCRIPTION OF THE DRAWINGS

The features and advantages of the present invention will become more apparent with a detailed description of the exemplary embodiments referencing the attached drawings.

DETAILED DESCRIPTION OF THE INVENTION

Figure 1:
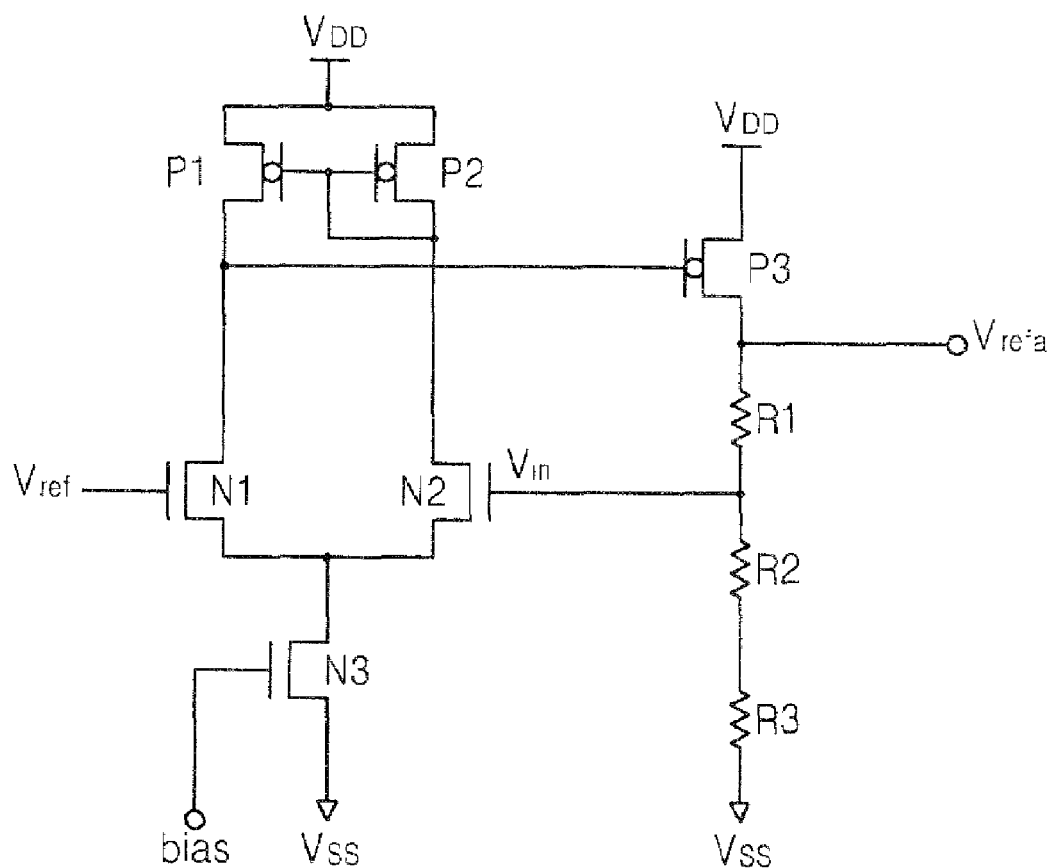
FIG. 1 is a circuit diagram of a conventional develop reference voltage generator.
Figure 2:
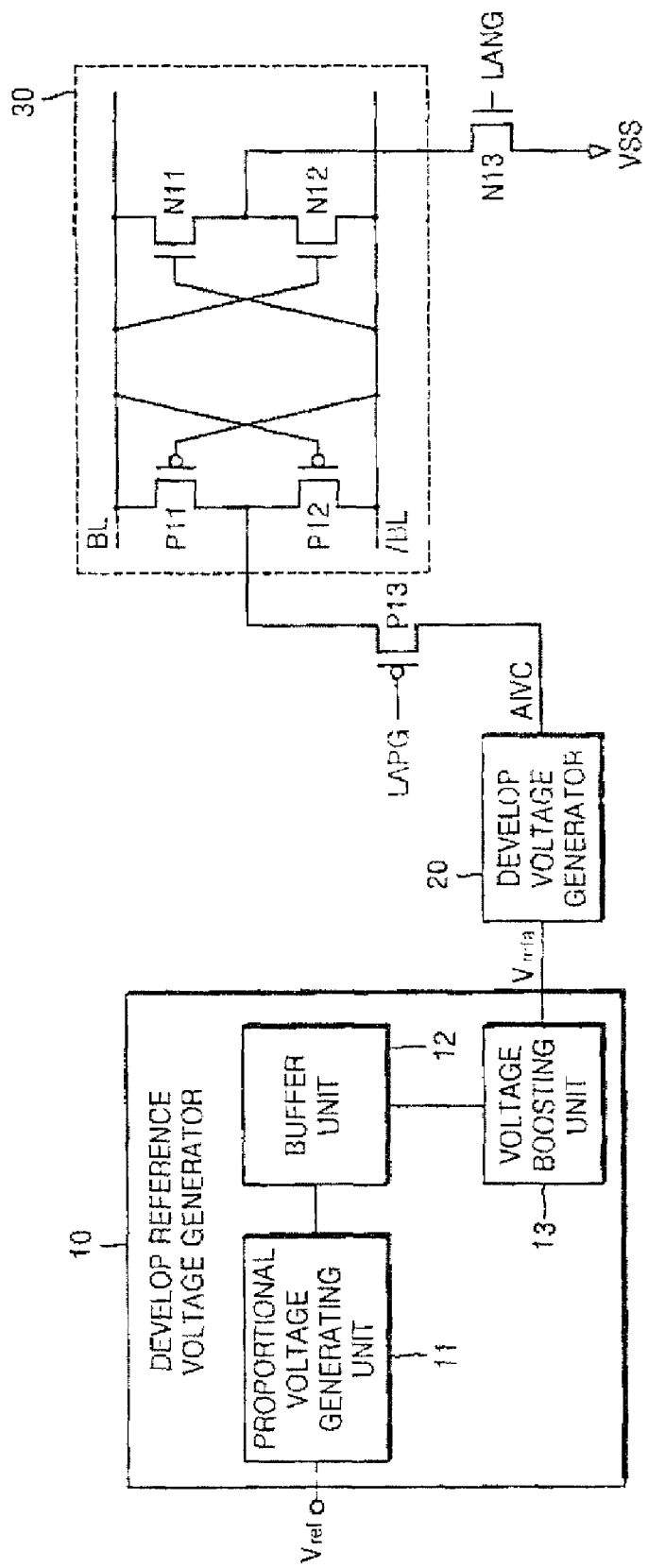
FIG. 2 is a block diagram of a memory device useful with embodiments of the present invention.

FIG. 2 is a block diagram of a memory device useful with embodiments of the present invention. Referring to FIG. 2, the memory device includes a develop reference voltage generator 10 to generate a develop reference voltage Vrefa responsive to a reference voltage Vref, a develop voltage generator 20 to generate a develop voltage AIVC responsive to the develop reference voltage Vrefa, and a sense amplifier 30 to sense and amplify a voltage difference between a pair of bit lines BL and /BL responsive to the develop voltage AIVC.

The develop reference voltage generator 10 includes a proportional voltage generating unit 11, a buffer unit 12, and a voltage boosting unit 13. The proportional voltage generating unit 11 receives the reference voltage Vref and generates a proportional reference voltage that is proportional to the first reference voltage Vref. For instance, the proportional voltage generating unit 11 may generate a proportional reference voltage that is substantially equal to α*Vref, where α is a constant.

The buffer unit 12 receives and buffers the proportional reference voltage. The buffer unit 12 may be coupled between the proportional voltage generating unit 11 and the voltage boosting unit 13 to electrically isolate them from each other.

The voltage boosting unit 13 receives the proportional reference voltage from the buffer unit 12, boosts the proportional reference voltage to generate the develop reference voltage Vrefa. When the boosted portion of the develop reference voltage is β, the develop reference voltage Vrefa may be described as (α*Vref)+β, where both α and β are constants. The value β may be the absolute value of the threshold voltage of a transistor included in the sense amplifier 30. For instance, when the sense amplifier 30 includes PMOS transistors P11 and P12 and NMOS transistors N11 and N12, as shown in FIG. 2, the value β may be the absolute value of the threshold voltage of the PMOS transistors P11 and P12 or the threshold voltage of the NMOS transistors N11 and N12.

The develop reference voltage Vrefa generated in the voltage boosting unit 13 is applied to the develop voltage generator 20. The develop voltage generator 20 receives the develop reference voltage Vrefa and generates the develop voltage AIVC. The develop voltage AIVC may have a high current level and the same voltage as the develop reference voltage Vrefa.

The sense amplifier 30 may pull up or pull down a voltage level of one or more of the bit lines BL and /BL responsive to the develop voltage AIVC. The memory device may include a pull-up PMOS transistor P13 to control the application of the develop voltage AIVC to the sense amplifier 30 responsive to a pull-up control signal LAPG. In some embodiments, the voltage boosting unit 13 may increase the voltage level of the proportional reference voltage according to the absolute value of the threshold voltage of the pull-up PMOS transistor P13.

Figure 3:
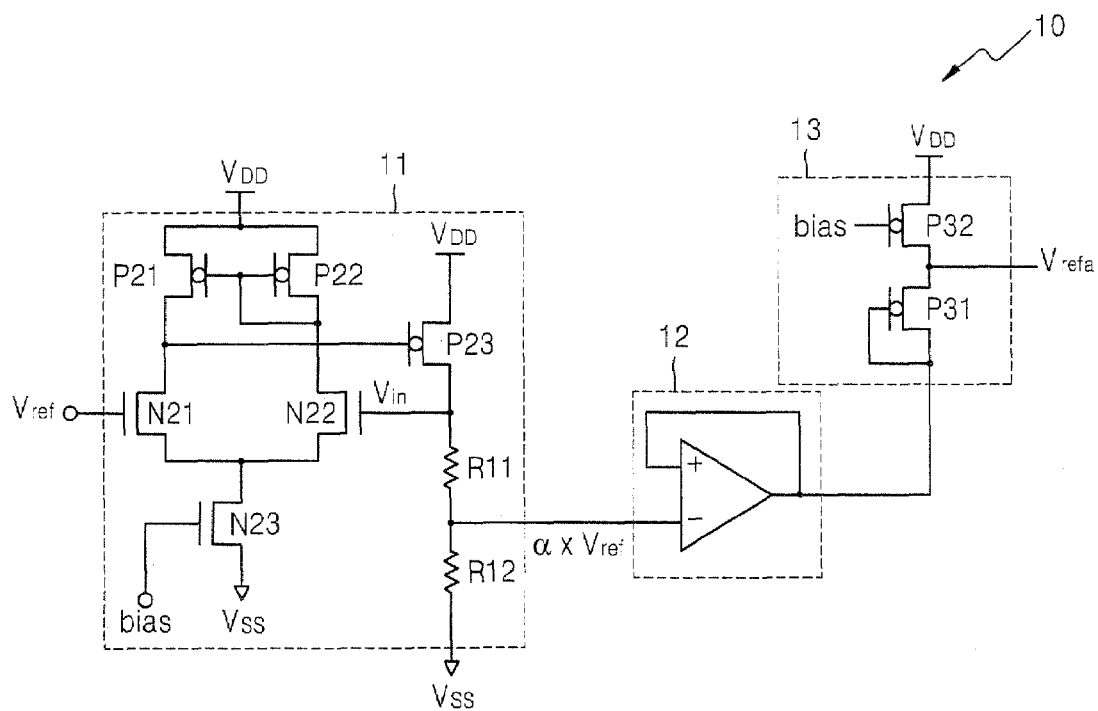
FIG. 3 is a circuit diagram embodiment of the develop reference voltage generator shown in FIG. 2.

FIG. 3 is a circuit diagram embodiment of the develop reference voltage generator 10 shown in FIG. 2. Referring to FIG. 3, the develop reference voltage generator 10 includes the proportional voltage generating unit 11, the buffer unit 12, and the voltage boosting unit 13.

The proportional voltage generating unit 11 includes a differential amplifier and a voltage divider. The differential amplifier includes PMOS transistors P21 and P22 coupled to a power supply voltage VDD, and NMOS transistors N21 and N22 coupled to the PMOS transistors P21 and P22, respectively. The reference voltage Vref and an input voltage Vin are applied to gates of the NMOS transistors N21 and N22, respectively. An enable transistor N23 is coupled between the NMOS transistors N21 and N22 and a ground voltage Vss. The enable transistor N23 receives a bias voltage to control the operation of the differential amplifier. When the differential amplifier performs a differential amplifying operation, until the input voltage Vin becomes substantially equal to the reference voltage Vref.

The voltage divider includes resistors R11 and R12 to divide the input voltage Vin. In some embodiments, the voltage divider may include more or less resistors than shown in FIG. 3. When a switch P23 coupled to the voltage divider is turned off, the voltage divider divides the input voltage Vin according to a ratio of the resistors R11 and R12. Thus the voltage output from the voltage divider is proportional to reference voltage Vref, tor α*Vref, where α is a constant. For instance, when the resistors R11 and R12 have the same resistance, the proportional reference voltage becomes 0.5*Vref.

The proportional voltage generating unit 11 provides the proportional reference voltage to the buffer unit 12. The buffer unit 12 receives and buffers the proportional reference voltage. Accordingly, the proportional voltage generating unit 11 and the voltage boosting unit 13 may be electrically isolated by the buffer 12.

The voltage boosting unit 13 receives the proportional reference voltage from the buffer 12, boosts the proportional reference voltage, and generates the develop reference voltage Vrefa. For example, the voltage boosting unit 13 can boost the proportional reference voltage by the absolute values of the threshold voltages of the PMOS transistors P11 and P12 included in the sense amplifier 30 of FIG. 2. The voltage boosting unit 13 may include a replica PMOS transistor P31 having the same threshold voltage as those of the PMOS transistors P11 and P12 included in the sense amplifier 30.

The voltage boosting unit 13 includes the replica transistor P31 and a switching transistor P32 disposed between the power supply voltage VDD and the replica transistor P31. The threshold voltage characteristics of the transistors may vary depending on process deviation in each die. Since the replica PMOS transistor P31 is formed using the same or similar process deviation as the PMOS transistors P11 and P12, the replica PMOS transistor P31 has the same or similar threshold voltage characteristics as those of the PMOS transistors P11 and P12.

The replica PMOS transistor P31 may be diode-connected such that the voltage boosting unit 13 boosts the proportional reference voltage by the absolute values of the threshold voltages of the PMOS transistors P11 and P12. The replica transistor P31 includes a first terminal is coupled to an output port, a second terminal is coupled to the buffer unit 12, and a control gate terminal coupled to, or diode-connected to the second terminal. The voltage of the output port is greater than that of the second terminal by the absolute value of the threshold voltage of the replica PMOS transistor P31, in accordance with the diode-connection characteristics of the replica transistor P31.

For example, when the resistances of the resistors R11 and R12 of the voltage divider are equal to each other and the absolute value of the threshold voltage of the replica transistor P31 is 0.7 V with a reference voltage Vref of 1 V, the develop reference voltage Vrefa becomes (0.5*Vref)+0.7=1.2V. When the threshold voltage of the PMOS transistors P11 and P12 is changed to 0.5 V, the develop reference voltage Vrefa is also changed to 1.0 V. Thus, threshold voltage variations in sense amplifiers generated during transistor formation can be accounted for by proportioning the reference voltage Vref and then boosting the proportional reference voltage. Accordingly, by uniformly maintaining the voltage for developing the pair of bit lines BL and /BL, the sensing speed of the sense amplifiers 30 may be stable.

Figure 4:
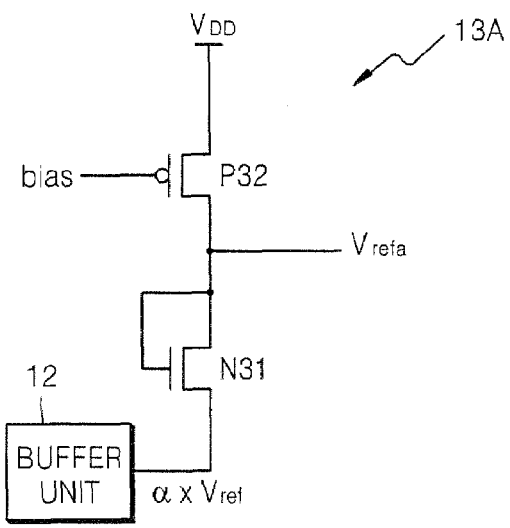
FIG. 4 is a circuit diagram embodiment of the voltage boosting unit shown in FIG. 2.

FIG. 4 is a circuit diagram embodiment of the voltage boosting unit 13A shown in FIG. 2. Referring to FIG. 4, a voltage boosting unit 13A includes a replica transistor N31 and a switching transistor P32 coupled between a power supply voltage VDD and the replica transistor N31. In particular, the replica transistor N31 may be an NMOS transistor, formed using the same or similar process deviation as the NMOS transistors N11 and N12 associated with the sense amplifier 30. The replica NMOS transistor N31 includes a first terminal coupled to the buffer unit 12, a second terminal coupled to an output port, and a control gate terminal couple to the second terminal in a diode-connection.

Accordingly, when the proportional reference voltage from the buffer unit 12 is α*Vref, the voltage boosting unit 13A generates a develop reference voltage Vrefa according to (α*Vref)+γ, where γ is the threshold voltage of the replica NMOS transistor N31. This develop reference voltage Vrefa allows the sense amplifier to maintain a voltage difference between the pair of the bit lines BL and /BL. Thus, even when a pull-down voltage varies due to the difference between the threshold voltages of the NMOS transistors N11 and N12 of the sense amplifier 30, the sense amplifier 30 may maintain a stable sensing speed.

Figure 5:
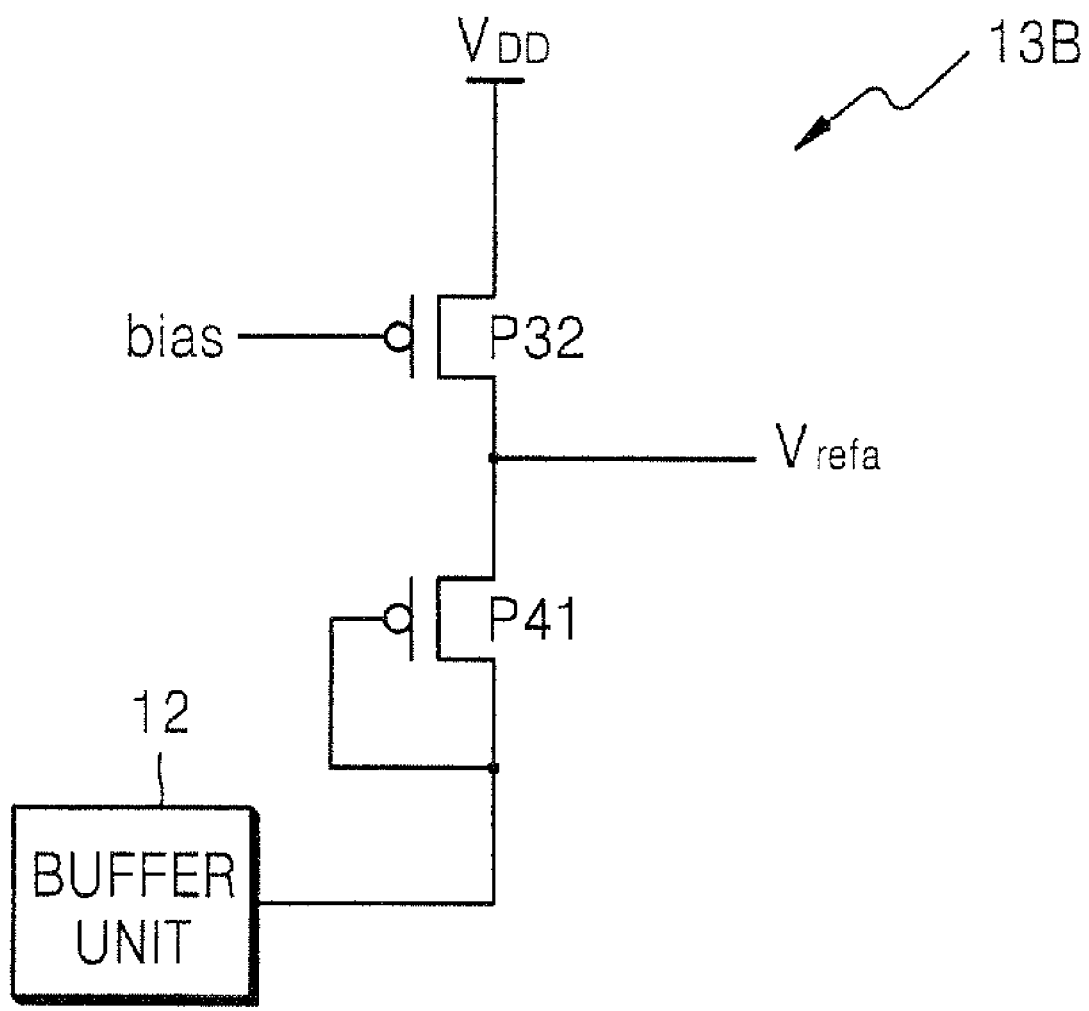
FIG. 5 is a circuit diagram of another embodiment of the voltage boosting unit shown in FIG. 2.

FIG. 5 is a circuit diagram of another embodiment of the voltage boosting unit 13B shown in FIG. 2. Referring to FIG. 5, the voltage boosting unit 13B includes a replica transistor P41, formed using the same or similar process deviation as that of the pull-up transistor (P13 of FIG. 2) for pulling up the voltage of the output port of the PMOS transistor of the sense amplifier 30. Similar to FIG. 4, a first terminal and a second terminal of the replica transistor P41 are coupled to a buffer unit 12 and an output port, respectively, and the second terminal and a control gate terminal of the replica transistor P41 are coupled to each other.

Accordingly, even when the threshold voltage of the pull-up transistor varies in every die, the develop voltage AIVC generated by the develop voltage generator 20 is uniformly applied to the sense amplifier 30 in each die and thus the sensing speed of the sense amplifier 30 can become stable.

Figure 6:
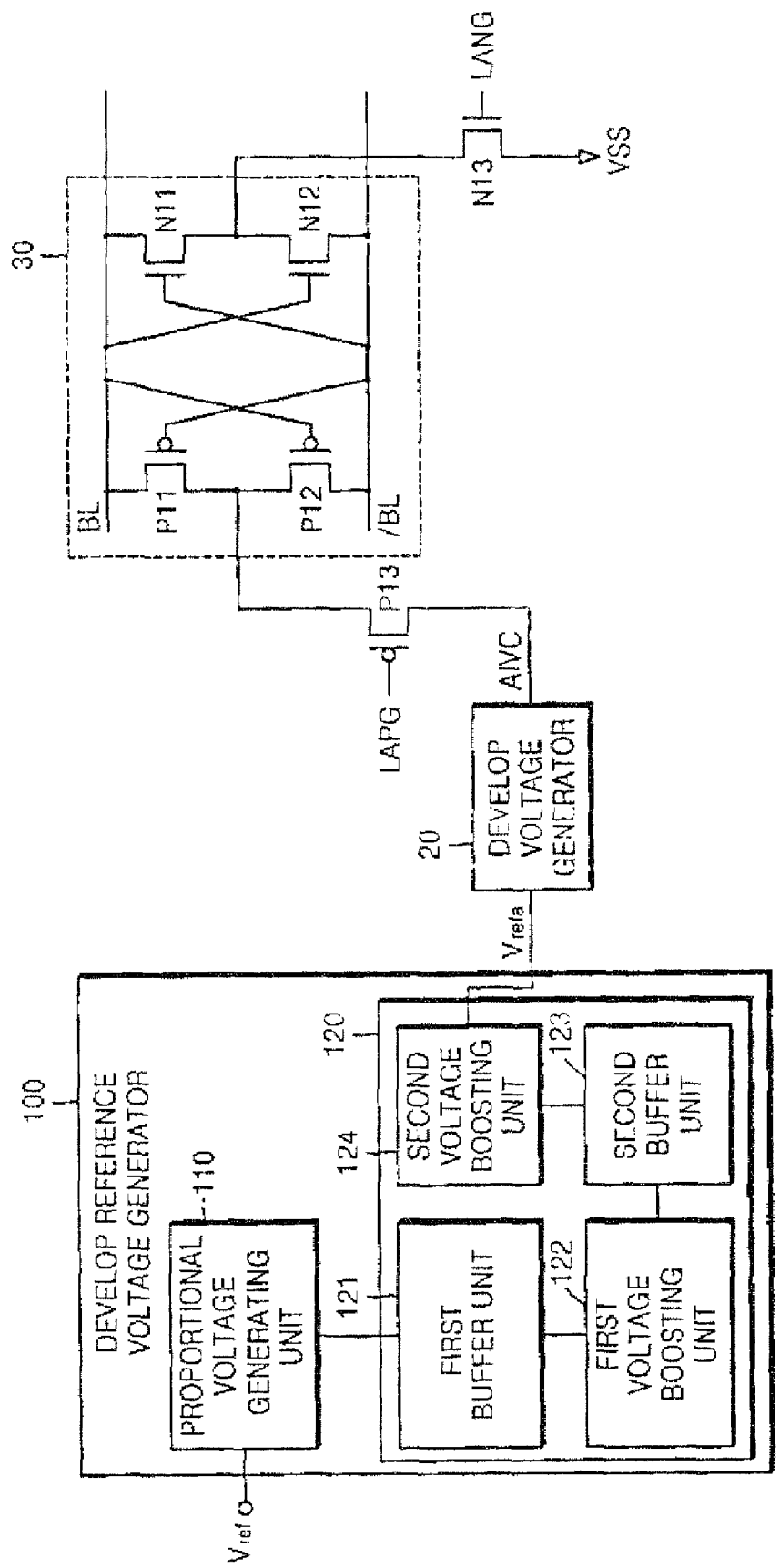
FIG. 6 is a block diagram of another memory device useful with embodiments of the present invention.

FIG. 6 is a block diagram of another memory device useful with embodiments of the present invention. The configuration and operation of a develop voltage generating circuit and a sense amplifier 30 shown in FIG. 6 are the same as those of the above-described embodiment illustrated in FIG. 2. Referring to FIG. 6, a develop reference voltage generator 100 includes a proportional voltage generating unit 110 and a develop reference voltage generating unit 120. The develop reference voltage generating unit 120 includes at least one buffer unit 121 and 123 and at least one voltage boosting unit 122 and 124. For example, the buffer unit includes a first buffer unit 121 and a second buffer unit 123, and the voltage boosting unit includes a first voltage boosting unit 122 and a second voltage boosting unit 124.

The proportional voltage generating unit 110 receives a first reference voltage Vref and generates a second reference voltage proportional to the first reference voltage Vref. The first buffer unit 121 receives and buffers the second reference voltage. The first buffer unit 121 generates a third reference voltage from the second reference voltage and provides the third reference voltage to the first voltage boosting unit 122.

The first voltage boosting unit 122 receives and boosts the third reference voltage to generate a fourth reference voltage. The second buffer unit 123 buffers the fourth reference voltage and generates a fifth reference voltage from the fourth reference voltage. The second voltage boosting unit 124 receives and boosts the fifth reference voltage to generate a develop reference voltage Vrefa.

In some embodiments, the first voltage boosting unit 122 boosts the third reference voltage by the absolute value of the threshold voltage of any one of PMOS transistors P11 and P12 included in the sense amplifier 30, NMOS transistors N11 and N12 included in the sense amplifier 30, or a pull-up PMOS transistor P13. The second voltage boosting unit 124 may boost the fifth reference voltage by the absolute value of the threshold voltage of another one of the above-described transistors. In other embodiments, the voltage boosting units 122 and 124 may boost the corresponding reference voltages by the threshold voltages associated with multiple transistors of the sense amplifier 30 and the pull-up PMOS transistor P13. The operation of the develop reference voltage generator 100 will be described in greater detail below in FIG. 7.

Figure 7:
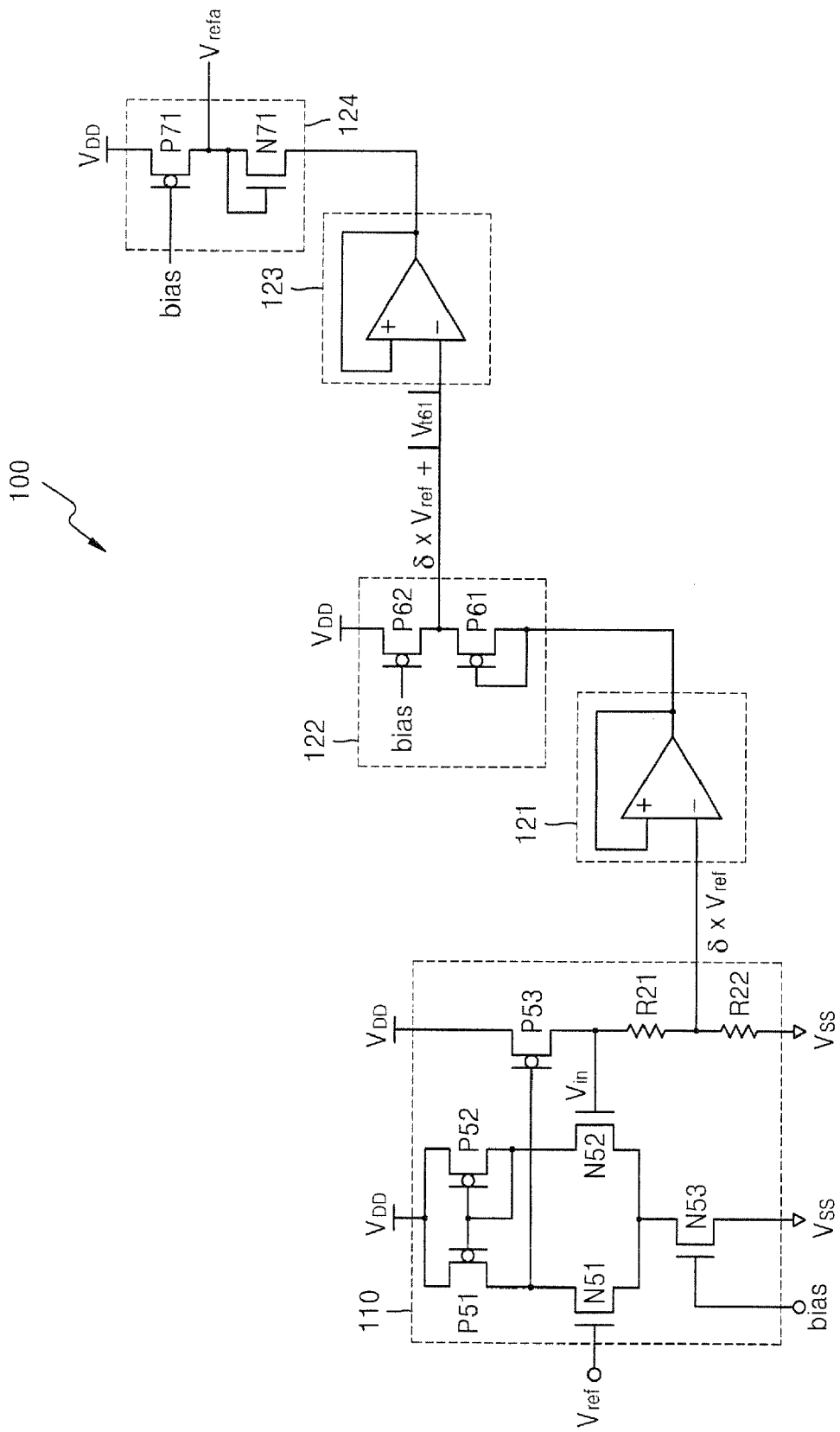
FIG. 7 is a circuit diagram embodiment of the develop reference voltage generator shown in FIG. 6.

FIG. 7 is a circuit diagram embodiment of the develop reference voltage generator shown in FIG. 6. Referring to FIG. 7, the proportional voltage generating unit 110 includes a differential amplifier and a voltage divider. The differential amplifier performs a differential amplifying operation to substantially equalize an input voltage Vin with the first reference voltage Vref. The voltage divider includes one or more resistors R21 and R22 to divide the input voltage Vin similarly to the voltage divider shown and described above with reference to FIG. 3.

The second reference voltage generated at the proportional voltage generating unit 110 is proportional to the first reference voltage Vref, and is shown as δ*Vref, where δ is a constant. The first buffer unit 121 buffers the second reference voltage and generates the third reference voltage from the second reference voltage.

The first voltage boosting unit 122 includes a replica transistor P61. The replica transistor P61 may be a PMOS transistor, and may be formed using the same or similar process deviation as the PMOS transistors P11 and P12 included in the sense amplifier 30. The replica transistor P61 may be diode-connected as shown and thus the fourth reference voltage generated by the first voltage boosting unit 122 may become $(\delta*Vref)+|v_{t61}|$, where $v_{t61}$ is the threshold voltage of replica transistor P61. The second buffer unit 123 receives and buffers the fourth reference voltage and generates the fifth reference voltage.

The second voltage boosting unit 124 receives and boosts the fifth reference voltage to generate the develop reference voltage Vrefa. The second voltage boosting unit 124 may include a diode-connected replica transistor N71. The replica transistor N71 may be an NMOS transistor, and may be formed using the same or similar process deviation as the NMOS transistors N11 and N12 included in the sense amplifier 30. The second voltage boosting unit 124 may increase the voltage level of the fifth reference voltage by the absolute value of the threshold voltage of the replica transistor N71. Accordingly, the generated develop reference voltage Vrefa may become $(\delta*Vref)+|v_{t61}|+|v_{t71}|$, where $v_{t71}$ is the threshold voltage of transistor N71.

For example, when the first reference voltage Vref is 1.0 V, resistors R21 and R22 respectively have resistances of 7K and 3K, the absolute value of the threshold voltage of the replica transistor P61 of the first voltage boosting unit 122 is 0.5 V, and the absolute value of the threshold voltage of the replica transistor N71 of the second voltage boosting unit 124 is 0.4 V, the generated develop reference voltage Vrefa becomes (0.3*1)+0.5+0.4=1.2 V. The generated develop voltage may also vary according to the variation of the threshold voltages of the PMOS transistors P11 and P12 and the NMOS transistors N11 and N12 of the sense amplifier 30.

Although FIG. 7 shows, the first voltage boosting unit 122 including a replica transistor P61 similar to the PMOS transistors P11 and P12 and the second voltage boosting unit 124 including the replica transistor N71 similar to the NMOS transistors N11 and N12, in some embodiments the first voltage boosting unit 122 may include a replica transistor of any one of the PMOS transistors P11 and P12 included in the sense amplifier 30, the NMOS transistors N11 and N12 included in the sense amplifier 30, and a pull-up transistor P13. The second voltage boosting unit 124 may also include a replica transistor of the other of the above-described transistors.

Even when at least two of the PMOS transistors P11 and P12 inc, the NMOS transistors N11 and N12, and the pull-up transistor P13 have different transistor characteristics in each die, the voltage difference between the pair of bit lines BL and /BL connected to the sense amplifier 30 can be uniformly maintained, and thus sensing speed can become stable.

While the present invention has been particularly shown and described with reference to exemplary embodiments thereof it will be understood by those of ordinary skill in the art that various changes in form and details may be made therein without departing from the spirit and scope of the present invention as defined by the following claims.

I claim:
1. A device comprising:
   a sense amplifier to sense a voltage difference between a plurality of bit lines responsive to a develop voltage signal; and
   a voltage generator to generate the develop voltage signal responsive to a reference voltage signal and responsive to a characteristic of a threshold voltage of at least one transistor of the sense amplifier,
   wherein the characteristic of the threshold voltage of the at least one transistor of the sense amplifier is substantially the same as a characteristic of a threshold voltage of at least one transistor of the voltage generator.
2. The device of claim 1 where the voltage generator includes
   a develop voltage generator to generate the develop voltage signal responsive to a develop reference voltage signal; and
   a develop reference voltage generator to generate the develop reference voltage signal responsive to the reference voltage signal;
   where the develop reference voltage generator includes at least one voltage boosting unit to increase a voltage level of the develop reference voltage signal according to the characteristic of the threshold voltage of the transistor.
3. The device of claim 2 where the voltage boosting unit increases the voltage level of the develop reference voltage signal according to one or more threshold voltages of transistors of the sense amplifier.
4. The device of claim 2 where the develop reference voltage generator includes a proportional voltage generating unit to generate a proportional reference voltage signal responsive to the reference voltage signal, where the voltage boosting unit is adapted to increase the voltage level of the proportional reference voltage signal; and
   at least one buffer to buffer the proportional reference voltage signal and provide the proportional reference voltage signal to a corresponding voltage boosting unit.
5. The device of claim 2 where the develop reference voltage generator includes a first voltage boosting unit to increase the voltage level of the develop reference voltage signal by an absolute value of a threshold voltage associated with a first transistor; and
   a second voltage boosting unit to increase the voltage level of the develop reference voltage signal by a second absolute value of a second threshold voltage associated with a second transistor.
6. The device of claim 5 where the develop reference voltage generator includes a first buffer to buffer a proportional reference voltage signal and provide the proportional reference voltage signal to the first voltage boosting unit; and
   a second buffer to buffer the proportional reference voltage signal from the first voltage boosting unit and provide the proportional reference voltage signal to the second voltage boosting unit.

7. The device of claim 2 where the voltage boosting unit includes a replica transistor having substantially the same threshold voltage as at least one transistor of the sense amplifier.
8. The device of claim 7 further comprising a transistor disposed between the develop voltage generator and the sense amplifier and adapted to at least pull-up a voltage associated with at least one of the bit lines, pull-down a voltage associated with at least one of the bit lines, or control the application of the develop voltage signal to the sense amplifier.
9. The device of claim 1 where the transistor of the sense amplifier is adapted to at least pull-up or pull-down a voltage associated with at least one of the bit lines responsive to the develop voltage signal; and
   where the voltage generator increases a voltage level of the develop voltage signal by an absolute value of a threshold voltage of at least one of the transistors.
10. The device of claim 1 where the voltage generator is configured to generate the develop voltage signal responsive to a process deviation of the at least one transistor of the sense amplifier, wherein the process deviation of the at least one transistor of the sense amplifier is substantially the same as a process deviation of at least one transistor of the voltage generator.
11. A method comprising:
    generating a develop voltage signal responsive to a reference voltage signal and responsive to a characteristic of a threshold voltage of at least one transistor of a sense amplifier; and
    sensing a voltage difference between a plurality of bit lines responsive to the develop voltage signal;
    boosting the voltage level of a proportional reference voltage signal by an absolute value of a threshold voltage associated with a transistor of the sense amplifier, where the proportional reference voltage signal is substantially proportional to the reference voltage signal;
    buffering the boosted reference voltage signal; and
    boosting the voltage level of the buffered reference voltage signal by an absolute value of a threshold voltage associated with another transistor of the sense amplifier.
12. The method of claim 11 includes
    generating a develop reference voltage signal responsive to the reference voltage signal;
    developing a voltage level of the develop reference voltage signal according to the characteristic of the threshold voltage of the transistor; and
    generating the develop voltage signal responsive to the develop reference voltage signal.
13. The method of claim 12
    generating the proportional reference voltage signal responsive to the reference voltage signal; and
    increasing the voltage level of the proportional reference voltage signal according to the characteristic of the threshold voltage of the transistor of the sense amplifier.
14. The method of claim 11 where a transistor coupled to the sense amplifier is adapted to at least pull-up a voltage associated with at least one of the bit lines, pull-down a voltage associated with at least one of the bit lines, or control the application of the develop voltage signal to the sense amplifier.
15. The method of claim 11 where generating the develop voltage signal is performed responsive to a process deviation of the at least one transistor of the sense amplifier, wherein the process deviation of the at least one transistor of the sense amplifier is substantially the same as a process deviation of at least one transistor of a voltage generator used to generate the develop voltage signal.

16. A device comprising:
a sense amplifier to sense a voltage difference between a plurality of bit lines responsive to a develop voltage signal;
a voltage generator to generate the develop voltage signal responsive to a reference voltage signal and an electrical characteristic of at least one transistor associated with the sense amplifier;
a develop voltage generator to generate the develop voltage signal responsive to a develop reference voltage signal;
a develop reference voltage generator to generate the develop reference voltage signal responsive to the reference voltage signal;
where the develop reference voltage generator includes at least one voltage boosting unit to increase a voltage level of the develop reference voltage signal according to the electrical characteristic of the transistor;
where the develop reference voltage generator includes a proportional voltage generating unit to generate a proportional reference voltage signal responsive to the reference voltage signal, where the voltage boosting unit is adapted to increase the voltage level of the proportional reference voltage signal; and
at least one buffer to buffer the proportional reference voltage signal and provide the proportional reference voltage signal to a corresponding voltage boosting unit.

17. A device comprising:
a sense amplifier to sense a voltage difference between a plurality of bit lines responsive to a develop voltage signal;
a voltage generator to generate the develop voltage signal responsive to a reference voltage signal and an electrical characteristic of at least one transistor associated with the sense amplifier;
a develop voltage generator to generate the develop voltage signal responsive to a develop reference voltage signal;
a develop reference voltage generator to generate the develop reference voltage signal responsive to the reference voltage signal;
where the develop reference voltage generator includes:
 a first voltage boosting unit to increase the voltage level of the develop reference voltage signal by an absolute value of a threshold voltage associated with a first transistor;
 a second voltage boosting unit to increase the voltage level of the develop reference voltage signal by an absolute value of a threshold voltage associated with a second transistor;
 a first buffer to buffer a proportional reference voltage signal and provide the proportional reference voltage signal to the first voltage boosting unit; and
 a second buffer to buffer the proportional reference voltage signal from the first voltage boosting unit and provide the proportional reference voltage signal to the second voltage boosting unit.

18. A method comprising:
generating a develop voltage signal responsive to a reference voltage signal and an electrical characteristic of at least one transistor associated with a sense amplifier;
sensing a voltage difference between a plurality of bit lines responsive to the develop voltage signal;
generating a develop reference voltage signal responsive to the reference voltage signal;
developing a voltage level of the develop reference voltage signal according to the electrical characteristic of the transistor;
generating the develop voltage signal responsive to the develop reference voltage signal;
generating a proportional reference voltage signal responsive to the reference voltage signal, where the proportional reference voltage signal is substantially proportional to the reference voltage signal;
buffering the proportional reference voltage signal;
increasing the voltage level of the proportional reference voltage signal according to the electrical characteristic of the transistor associated with the sense amplifier;
boosting the voltage level of the proportional reference voltage signal by an absolute value of a threshold voltage associated with a transistor associated with the sense amplifier;
buffering the boosted reference voltage signal; and
boosting the voltage level of the buffered reference voltage signal by an absolute value of a threshold voltage associated with another transistor associated with the sense amplifier.

19. A device comprising:
means for sensing a voltage difference between a plurality of bit lines responsive to a develop voltage signal;
means for generating the develop voltage signal responsive to a reference voltage signal and an electrical characteristic of at least one transistor associated with the means for sensing;
means for generating the develop voltage signal responsive to a develop reference voltage signal;
means for generating the develop reference voltage signal responsive to the reference voltage signal;
where the means for generating the develop reference voltage signal includes at least one means for boosting a voltage level of the develop reference voltage signal according to the electrical characteristic of the transistor;
means for generating a proportional reference voltage signal responsive to the reference voltage signal, where the means for boosting is adapted to increase the voltage level of the proportional reference voltage signal; and
means for buffering the proportional reference voltage signal and for providing the proportional reference voltage signal to a corresponding means for boosting.

20. The device of claim 19 where the means for boosting increases the voltage level of the develop reference voltage signal according to one or more threshold voltages of transistors associated with the sense amplifier.

21. The device of claim 19 where the means for generating the develop reference voltage includes:
first voltage boosting means for increasing the voltage level of the develop reference voltage signal by an absolute value of a threshold voltage associated with a first transistor; and
second voltage boosting means for increasing the voltage level of the develop reference voltage signal by an absolute value of a threshold voltage associated with a second transistor.

22. The device of claim 21 where the means for generating the develop reference voltage includes:
first buffer means for buffering the proportional reference voltage signal and providing the proportional reference voltage signal to the first voltage boosting means; and
second buffer for buffering the proportional reference voltage signal from the first voltage boosting means and providing the proportional reference voltage signal to the second voltage boosting means.

23. A device comprising:
means for sensing a voltage difference between a plurality of bit lines responsive to a develop voltage signal;
means for generating the develop voltage signal responsive to a reference voltage signal and an electrical characteristic of at least one transistor associated with the means for sensing;
means for generating the develop voltage signal responsive to a develop reference voltage signal;
means for generating the develop reference voltage signal responsive to the reference voltage signal;
where the means for generating the develop reference voltage signal includes at least one means for boosting a voltage level of the develop reference voltage signal according to the electrical characteristic of the transistor;
first voltage boosting means for increasing the voltage level of the develop reference voltage signal by an absolute value of a threshold voltage associated with a first transistor; and
second voltage boosting means for increasing the voltage level of the develop reference voltage signal by an absolute value of a threshold voltage associated with a second transistor;
where the means for generating the develop reference voltage signal further includes:
first buffer means for buffering a proportional reference voltage signal and providing the proportional reference voltage signal to the first voltage boosting means; and
second buffer means for buffering the proportional reference voltage signal from the first voltage boosting means and providing the proportional reference voltage signal to the second voltage boosting means.

24. The device of claim 23 where the means for generating the develop reference voltage includes
means for generating the proportional reference voltage signal responsive to the reference voltage signal, where the first and second voltage boosting means are adapted to increase the voltage level of the proportional reference voltage signal.

\* \* \* \* \*

UNITED STATES PATENT AND TRADEMARK OFFICE
CERTIFICATE OF CORRECTION

PATENT NO. : 7,561,479 B2  Page 1 of 1
APPLICATION NO. : 11/465314
DATED : July 14, 2009
INVENTOR(S) : Dong-Su Lee It is certified that error appears in the above-identified patent and that said Letters Patent is hereby corrected as shown below:

Column 7, line 7, the word "thereof" should read -- thereof, --.

Signed and Sealed this

Fifteenth Day of September, 2009

David J. Kappos
*Director of the United States Patent and Trademark Office*